United States Patent
Camlica

(10) Patent No.: US 12,054,240 B2
(45) Date of Patent: Aug. 6, 2024

(54) ACTUATOR SETUP

(71) Applicant: TUSAS-TURK HAVACILIK VE UZAY SANAYII ANONIM SIRKETI, Ankara (TR)

(72) Inventor: Fahri Bugra Camlica, Ankara (TR)

(73) Assignee: TUSAS-TURK HAVACILIK VE UZAY SANAYII AS, Ankara (TR)

( * ) Notice: Subject to any disclaimer, the term of this patent is extended or adjusted under 35 U.S.C. 154(b) by 58 days.

(21) Appl. No.: 18/016,894

(22) PCT Filed: Apr. 26, 2021

(86) PCT No.: PCT/TR2021/050380
§ 371 (c)(1),
(2) Date: Jan. 19, 2023

(87) PCT Pub. No.: WO2022/019856
PCT Pub. Date: Jan. 27, 2022

(65) Prior Publication Data
US 2023/0348044 A1 Nov. 2, 2023

(30) Foreign Application Priority Data

Jul. 23, 2020 (TR) ................................ 2020/11722

(51) Int. Cl.
*B64C 13/28* (2006.01)
*B64C 13/04* (2006.01)
*B64C 13/50* (2006.01)

(52) U.S. Cl.
CPC ............ *B64C 13/503* (2013.01); *B64C 13/04* (2013.01); *B64C 13/28* (2013.01)

(58) Field of Classification Search
CPC ........ B64C 13/503; B64C 13/04; B64C 13/28
See application file for complete search history.

(56) References Cited

U.S. PATENT DOCUMENTS

| 6,545,384 B1 * | 4/2003 | Pelrine | F02G 1/043 |
| | | | 977/788 |
| 2007/0036653 A1 * | 2/2007 | Bak | F03D 7/0232 |
| | | | 416/98 |

(Continued)

FOREIGN PATENT DOCUMENTS

| EP | 2233735 A2 | 9/2010 |
| GB | 2555480 A | 5/2018 |

(Continued)

OTHER PUBLICATIONS

International Search Report and Written Opinion for PCT application No. PCT/TR2021/050380, mailed Oct. 18, 2021.

(Continued)

*Primary Examiner* — Tye William Abell
(74) *Attorney, Agent, or Firm* — Notaro, Michalos & Zaccaria P.C.

(57) ABSTRACT

An actuator setup is disclosed which includes a body, at least one control surface located on the body for enabling to control the flow of fluid by moving relative to the body, at least one actuator produced from an electro-active polymer material that is located between the body and the control surface and changes its form depending on electrical energy, thereby triggering the control surface, at least one strengthener located on the actuator, enabling the actuator to change its form, a strengthener located on the actuator so as to be in connection with the body and having a front strengthener and a rear strengthener located on the actuator so as to be oppositely positioned with the front strengthener.

10 Claims, 3 Drawing Sheets

(56) References Cited

U.S. PATENT DOCUMENTS

Figure 1:
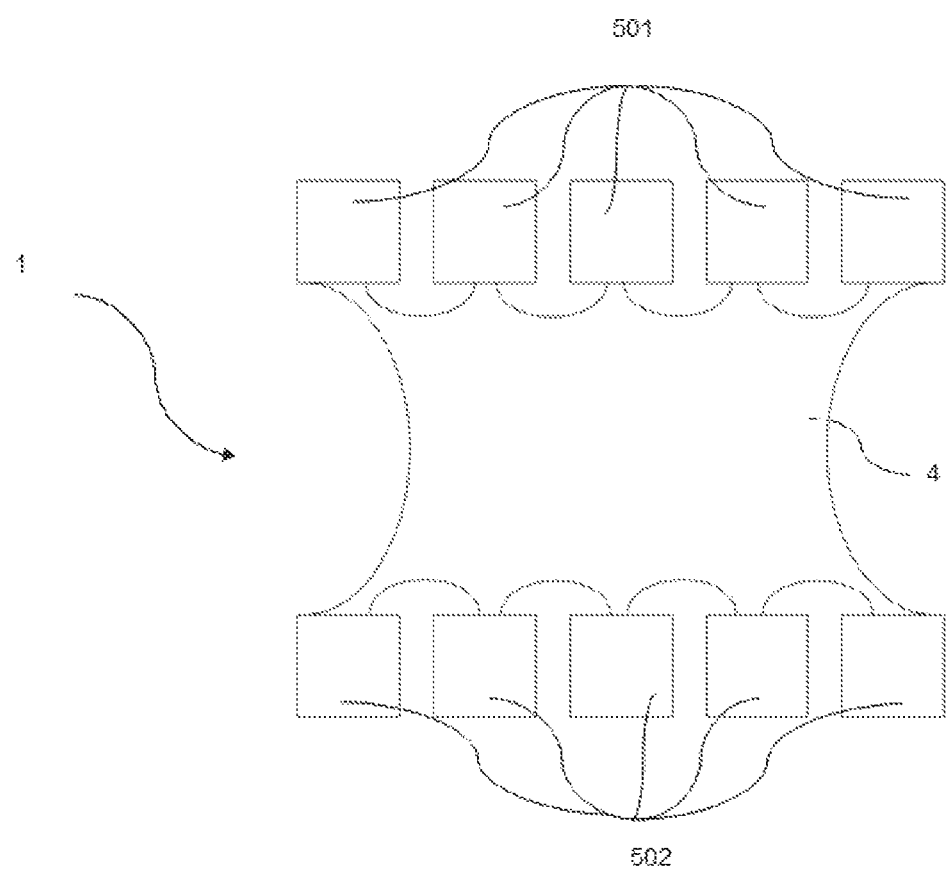

| | | | |
|---|---|---|---|
| 2009/0162199 A1* | 6/2009 | Bernhard | B64C 27/615 244/215 |
| 2010/0247314 A1* | 9/2010 | Narasimalu | F03D 7/0232 416/146 R |
| 2015/0001994 A1* | 1/2015 | Ahn | H10N 30/2046 310/330 |
| 2017/0203829 A1* | 7/2017 | Brown | B64C 3/44 |

FOREIGN PATENT DOCUMENTS

| | | |
|---|---|---|
| KR | 20150056340 A | 5/2015 |
| WO | 2010151230 A2 | 12/2010 |

OTHER PUBLICATIONS

International Preliminary Report on Patentability, completed Nov. 25, 2022.
Demand/Request for Preliminary Examination dated May 20, 2022.
International Application Status Report generated Jan. 13, 2023.
Written Opinion of International Preliminary Examining Authority mailed Jul. 29, 2022.
Response to Office Action dated Sep. 29, 2022.

* cited by examiner

Figure — 1

ACTUATOR SETUP

This invention relates to an actuator setup enabling to increase the efficiency of an actuator by changing the actuator form.

Actuators produced with elastomeric materials that structurally possess viscosity and elasticity convert electrical energy into mechanical energy. Dielectric elastomeric actuators are arrangements with carbon film structure fixed to a support element from two opposite sides. Dielectric elastomeric actuators used in artificial muscle applications can also be used in air and/or space vehicles for moving attachments in the wing parts to enable the air vehicle to perform movements such as landing, takeoff, turning, or displacement during flight. Dielectric elastomer actuators (DEA) work on the principle of converting mechanical energy into electrical energy. Theoretically, dielectric elastomer actuators, which can convert electrical energy into mechanical energy at high efficiency, are preferred due to their lightness, flexibility, low energy requirement, and low production costs.

During the manufacture of elastomeric actuators, if their existing thickness is not suitable for actuator production, their thickness is reduced by being stretched from one or two axes. After the stretching process is completed, one of the axes is fixed and the tension in the fixed direction is maintained once. During the use of the actuator, in turn, the performance is increased by changing the tension generated in the fixed direction.

The actuation of the control surfaces in air and/or space vehicle is carried out by a flight control system operating in dependence on the location commands given by the flight crew or autopilot software. In general practice, actuators are used to drive the control surfaces and actuators are driven by a central drive unit and various mechanical transmission elements connected thereto.

The Japanese patent document JP20160257445, which is included in the known state of the art, discloses an actuator and a production method thereof. During the manufacture of the actuator, it is mentioned that the actuator is stretched in two axes thanks to a bi-axis tensioning jaw.

Another patent document is EP2233735A2 which forms part of the state of the art. EP2233735A2 is describing a wind turbine blade comprising a main blade body and trailing edge section movably connected to the main blade body. The wind turbine blade comprises an actuator structure for causing the trailing edge section of a blade to move relative to a main blade portion. The actuator structure comprises a stack of piezoelectric elements.

Thanks to an actuator setup developed by this invention, the performance is increased during the use of the actuator by changing the tension generated in the fixed direction with more than one uniaxial tensioning jaw.

Thanks to an actuator setup developed by this invention, the actuation of the control surfaces is carried out in a more practical, efficient and reliable manner.

A further object of this invention is to complete the maintenance and repair activities in a shorter period of time.

A further object of the present invention is a low-cost, reliable actuator setup system.

A further object of the present invention is a faster, reliable actuator setup system.

The actuator setup developed to realize the object of this invention and defined in the first claim and in the claims depending thereon, comprises a body, a control surface located on the body and being able to move relative to the body and a part thereof being able to approach and move away from the body, at least one actuator produced from an electro-active polymer material that converts electrical energy from an electrical power source into mechanical work to enable the control surface to move to a user-determined position, that is triggered with electrical energy, that changes shape by elongation, contraction and/or expansion, that returns to its non-deformed state when no electrical energy is applied, and that triggers the control surface to move during the deformation, at least two strengtheners detachably attached onto the actuator and located at two opposite sides so as to be in connection with the body and control surfaces to allow the actuator to be adhered thereto.

The actuator setup of the invention comprises more than one front strengthener and rear strengthener, each of which is differently or identically powered and located on the body and control surface, allowing almost a complete regional form change to take place in the actuator by changing the length and/or tension of the actuator. Thanks to this, the most appropriate tension is provided during the use of actuator by changing the tension generated in the fixed direction with more than one uniaxial retainer. Thanks to this, an identical tension in almost the entire surface of the actuator that is stretched in a uniaxial manner is achieved or it is enabled to adjust the tension on the actuator depending on the maneuver.

In an embodiment of the invention, an actuator setup comprises a control unit that controls each of the multiple front strengtheners and each of the multiple rear strengtheners individually according to the commands given by a user and enables them to be triggered separately by electrical energy. The potential applied by the control unit causes the generation of an electric field and enables the dielectric actuator to be compressed.

In an embodiment of the invention, an actuator setup comprises an actuator produced from a dielectric elastomeric material. Thanks to this, it contains an actuator that changes its form by converting electrical energy due to the potential applied to it into mechanical work.

In an embodiment of the invention, an actuator setup comprises a motor located on the body, triggering the strengthener to allow the control surface to change its position and to maneuver. The operation of the motor is controlled by the control unit. Thanks to the motor, it allows the control surface located on the air vehicle to change its position, into which the strengthener can enter and exit, during the flight in a forward-backward, upward-downward or angular way, or the combinations thereof.

In an embodiment of the invention, an actuator setup comprises more than one front strengthener and/or more than one rear strengthener in the form of a protrusion, located as a point on the body and/or the control surface, extending outward from the body and/or the control surface, and enabling the actuator to reduce its regional deformation and/or to change its regional form. Thanks to this, the actuators stretched by the strengthener are enabled to reduce the deformation stress.

In an embodiment of the invention, an actuator setup, with a strengthener having a rough surface that enables the retainer to be held on the actuator by increasing its friction force, the actuator is enabled to adhere onto the strengthener. Thanks to this, it forms a more reliable system.

In an embodiment of the invention, an actuator setup, the distance between at least two strengtheners can be positioned manually or automatically and/or in a controlled or uncontrolled manner. Thanks to this, the amount of elongation of the actuator can change towards the perpendicular of the strengthener's motion direction and it is enabled to adjust its tension on the actuator.

In an embodiment of the invention, an actuator setup, at least one switch mechanism is used to provide support in positioning multiple strengtheners relative to each other. With the switch mechanism, the positions of the strengtheners retained on the actuator can be adjusted.

In an embodiment of the invention, an actuator setup comprises an actuator extending perpendicular to the direction of movement of the strengthener. With at least one connection member located closer to the actuator's center than the strengthener, the deformation of the actuator is decreased.

In an embodiment of the invention, an actuator setup, more than one strengthener, at least one of which having a different geometry from the other, can be produced from different geometries, and thanks to this, compliance is provided to different actuator types.

In an embodiment of the invention, an actuator setup comprises at least two electrodes enabling the actuator to be triggered and an actuator consisting of one or more layers of a square or circular shaped dielectric elastomer located between the electrodes. Conductive electrodes are located on both surfaces of the actuator, said electrodes being able to deform in line with the deformation of the actuator. Electrodes can usually be in powder/oil form or the form of a thin metal film. With a potential applied to the electrodes by the control unit, positive and negative electrodes cause the generation of an electric field and enable the actuator with a dielectric structure staying between the electrodes to be compressed.

In an embodiment of the invention, an actuator setup comprises a body which is a wing, vertical stabilizer, horizontal stabilizer, or an airframe. Thanks to this, the actuator setup can also be used in air vehicles.

In an embodiment of the invention, an actuator setup, it is enabled to use the actuator setup during flight thanks to a control unit that enables the actuators to be triggered according to the commands received from the flight crew or autopilot software.

In an embodiment of the invention, an actuator setup comprises an actuator comprising silicone/graphite, carbon and/or silver-based material enabling it to increase its electrical conductivity. Thanks to this, the actuator's conductivity is increased.

In an embodiment of the invention, an actuator setup comprises a strengthener that can be used during an air vehicle's flight and enables the length and/or tension of the actuator to be changed by changing its position. Thanks to this, during the flight of the air vehicle, it enables to change its position during flight in a forward-backward, upward-downward or angular manner, or in the combinations thereof.

Figure 2:
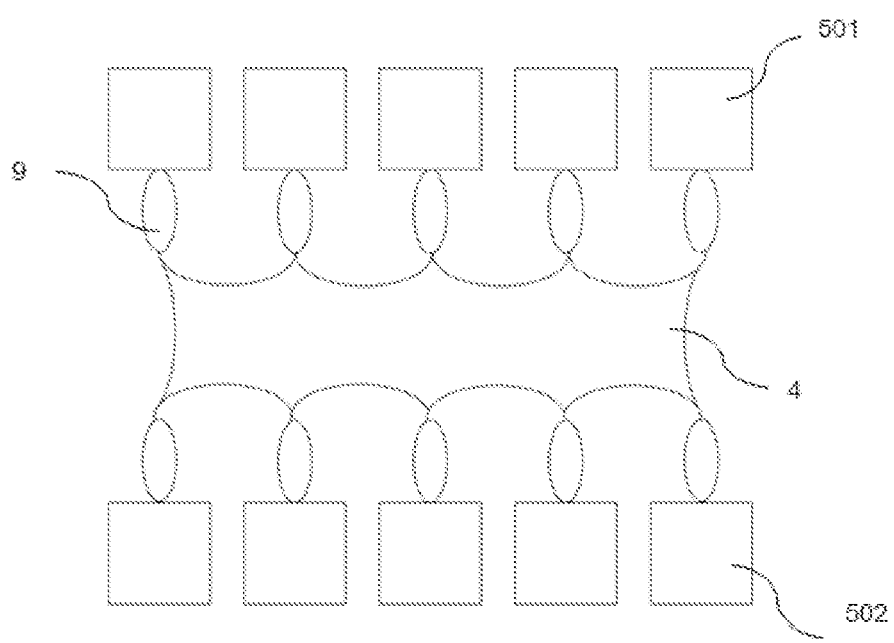
Figure 3:
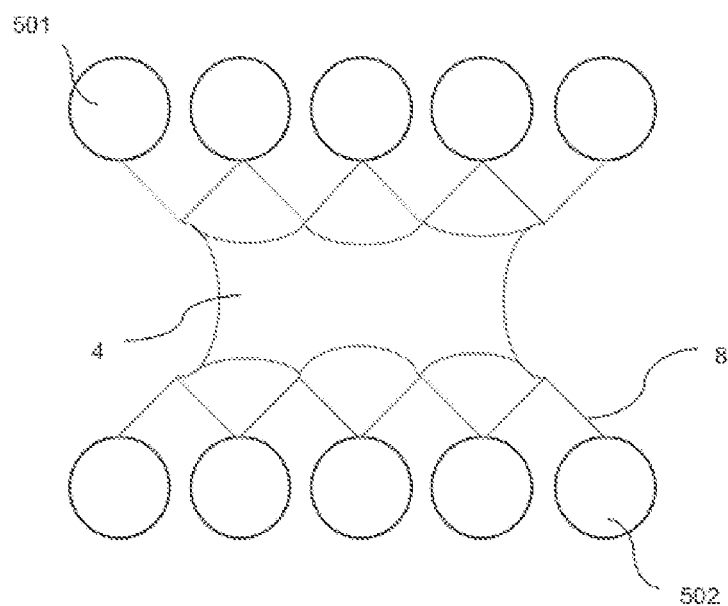
Figure 4:
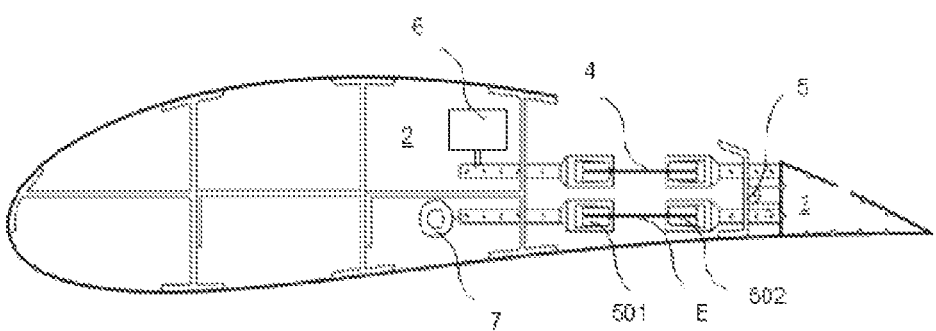

The actuator setup realized to achieve the object of the present invention is shown in the accompanying FIGURES, wherein among which;

FIG. 1—is a schematic view of the actuator setup.
FIG. 2—is a schematic view of the actuator setup.
FIG. 3—is a schematic view of the actuator setup's switch mechanism.
FIG. 4—is a schematic view of the actuator setup on an air vehicle.

All the parts illustrated in FIGURES are individually assigned a reference numeral and the corresponding terms of these numbers are listed below.

1. Actuator setup
2. Body
3. Control surface
4. Actuator
5. Strengthener
501. Front strengthener
502. Rear strengthener
6. Control unit
7. Motor
8. Switch mechanism
9. Connection element
(E) Electrode The actuator setup (1) comprises a body (2), at least one control surface (3) located on the body (2), enabling to control the flow of fluid by moving relative to the body (2), at least one actuator (4) produced from an electro-active polymer material that is located between the body (2) and the control surface (3) and changes its form depending on electrical 5 energy, thereby triggering the control surface (3), at least one strengthener (5) located on the actuator (4), enabling the actuator (4) to change its form, and having a front strengthener (501) located on the actuator (4) so as to be in connection with the body (2) and a rear strengthener (502) located on the actuator (4) so as to be oppositely positioned 10 with the front strengthener (501).

The actuator setup (1) of the invention comprises more than one front strengthener (501) and more than one rear strengthener (502), each of which being able to be powered identically or differently depending on the energy they are subjected to for changing the regional form of the actuator (4).

The actuator setup (1) comprises a body (2), a control surface (3) capable to move relative to the body (2) and having a part that can approach or move away to/from the body (2). It comprises at least one actuator (4) produced from an electro-active polymer material that converts electrical energy into mechanical work, is triggered by electrical energy enabling the body (2) to move, returns to its non-deformed state when no electrical energy is applied, and actuates the control surface (3) as it changes its form and thus enables it to move. It comprises at least two strengtheners (5) detachably attached to the actuator (4), clamping the opposite edges and enabling the actuator (4) to hold onto it, and a strengthener (5) enabling the actuator (4) to change its form due to the force it is exposed to. They are positioned as a front strengthener (501) retaining the actuator (4) from the body (2) part, a rear strengthener (502) positioned oppositely to the front strengthener (501) so that the actuator (4) is in connection with the control surface (3).

The actuator setup (1) comprises more than one front strengthener (501) and more than one rear strengthener (502), each of which can be powered identically or differently depending on the force they are exposed to, enabling the actuator (4) to reduce its regional deformation by changing the length and/or tension of the actuator (4). Thanks to this, an equal tension in almost the entire surface of the actuator (4) is achieved or it is enabled to adjust the tension on the actuator (4) depending on the maneuver.

In an embodiment of the invention, the actuator setup (1) comprises a control unit (6) that controls each of the multiple front strengtheners (501) and each of the multiple rear strengtheners (502) individually according to user-given commands and enables them to be triggered separately by electrical energy. Thanks to this, the strengtheners (5) can be controlled by the control unit (6).

In an embodiment of the invention, the actuator setup (1) comprises an actuator (4) produced from a dielectric elastomeric material, thereby changing its form by a voltage applied to it. Thanks to this, the actuator's (4) tension is ensured by converting electrical energy into mechanical work.

In an embodiment of the invention, the actuator setup (1) comprises at least one motor (7) located on the body (2), triggering the strengthener (5) to enable the control surface (3) to change its position, and a control unit (6) controlling the operation of the motor (7). By means of the motor (7), more than one strengthener (5) is triggered and tension is provided on the actuator (4).

In an embodiment of the invention, the actuator setup (1) comprises a strengthener (5) as a point located on the body (2) and/or control surface (3), extending outward from the body (2) and/or control surface (3), and enabling the actuator (4) to change its form regionally. Thanks to this, it is ensured that the actuator (4) adheres to the strengtheners (5) at different distances.

In an embodiment of the invention, the actuator setup (1) comprises more than one front strengthener (501) and/or more than one rear strengthener (502), whose distances to each other can be positioned depending on a configuration predetermined by the user for changing the length and/or tension of the actuator (4). Thanks to this, the tension on the actuator (4) can be adjusted in dependence on the maneuver.

In an embodiment of the invention, the actuator setup (1) comprises a strengthener (5) with a rough surface enabling the front strengthener (501) and/or the rear strengthener (502) to be held by increasing the friction force on the actuator (4). Thanks to this, it is enabled to increase the grip force for the actuator (4) by the strengthener (5).

In an embodiment of the present invention, the actuator setup (1) comprises at least one switch mechanism (8) located on the actuator (4), enabling the distance between more than one front strengthener (501) and/or more than one rear strengthener (502) to remain identical. Thanks to this, it is enabled to adjust the distance between the two front strengtheners (501) and/or to adjust the distance between the two rear strengtheners (502).

In an embodiment of the invention, the actuator setup (1) comprises a connection element (9) enabling the strengthener (5) and the actuator (4) to be connected to each other, located on the strengthener (5) so as to remain between the strengthener (5) and the actuator (4), and enabling the strengthener (5) to be connected to the actuator (4). Thanks to the connection element (9), the actuator (4) provides almost a complete support with its dimensional change.

In an embodiment of the invention, the actuator setup (1) comprises more than one strengthener (5), at least one of which having a different geometry than the other. Thanks to this, the strengthener (5) and the actuator (4) are located in shape compliance. In an embodiment of the invention, the actuator setup (1) comprises at least two electrodes (E) that enable the actuator (4) to be triggered and an actuator (4) located between the electrodes (E), consisting of one or more layers of square or circular shaped dielectric elastomer. Thanks to this, the strengtheners (5) are enabled to be triggered by the electrodes (E).

In an embodiment of the invention, the actuator setup (1) comprises a body (2) which is a wing, vertical stabilizer, horizontal stabilizer, or an airframe. Thanks to this, by moving relatively on the wing it enables the air vehicle to maneuver and direct the air flow. In an embodiment of the invention, the actuator setup (1) comprises a control unit (6) that enables the actuators (4) to be triggered according to the commands received from the flight crew or autopilot software. Thanks to this, during the flight time, the triggering of actuator (4) can be performed depending on the control unit (6).

In an embodiment of the present invention, the actuator setup (1) comprises an actuator (4) comprising silicone/graphite, carbon and/or silver-based material that enables it to increase its electrical conductivity. The actuator (4) can change its shape by applying voltage by means of the control unit (6). Thus, materials having conductivity can stay in contact on the surfaces of actuator (4).

In an embodiment of the invention, the actuator setup (1) comprises a strengthener (5) that can be used during the flight of an air vehicle and allows the actuator (4) to change its form by changing its position. Thanks to this, it allows the tension on the actuator (4) to change while the air vehicle maneuvers during flight time.

The invention claimed is:
1. An actuator setup (1) comprising:
   a body (2),
   at least one control surface (3) located on the body (2) for enabling control of a flow of fluid during an air vehicle's flight by moving relative to the body (2),
   at least one actuator (4), located between the body (2) and the control surface (3), which changes form depending on electrical energy and thereby triggering the control surface (3),
   at least one strengthener (5) located on the actuator (4) for enabling the actuator (4) to change form and having a first front strengthener (501) located on the actuator (4) so as to be in connection with the body (2) and a first rear strengthener (502) located on the actuator (4) so as to be oppositely positioned with the front strengthener (501),
   at least two electrodes (E) that enable the actuator (4) to be triggered, one of the at least one actuator (4) located between the electrodes (E) and consisting of more than one layer of dielectric elastomer thereby changing form when electrical energy is applied and thereby triggering the control surface (3),
   a connection element (9) for connecting the strengthener (5) and the actuator (4) to each other, the connection element (9) located on the strengthener (5) so as to remain between the strengthener (5) and the actuator (4) and enabling the strengthener (5) to be connected to the actuator (4), and
   at least one additional front strengthener (501) and at least one additional rear strengthener (502) in the form of a protrusion, located as a point on the body (2) and/or the control surface (3), extending outward from the body (2) and/or the control surface (3), enabling the actuator (4) to reduce regional deformation and/or to change regional form and each of which being able to be powered identically or differently depending on the electrical energy they are subjected to for changing the regional form of the actuator (4).

2. The actuator setup (1) according to claim 1, comprising at least one motor (7) located on the body (2) for mechanically triggering the strengthener (5) to enable the control surface (3) to change position, and a control unit (6) for controlling the operation of the motor (7).

3. The actuator setup (1) according to claim 1, wherein the at least one additional front strengthener (501) and/or at least one additional rear strengthener (502) can be positioned a distance apart from each other that depends on a configuration predetermined by the user for changing the length and/or tension of the actuator (4).

4. The actuator setup (1) according to claim 1, wherein the strengthener (5) has a rough surface enabling the front strengthener (501) and/or the rear strengthener (502) to be held by increasing the friction force on the actuator (4).

5. The actuator setup (1) according to claim 1, comprising at least one switch mechanism (8) located on the actuator (4) for enabling the distance between the more than one front strengthener (501) and/or the more than one rear strengthener (502) to remain identical.

6. The actuator setup (1) according to claim 1, comprising more than one strengthener (5), at least one of which having a different geometry than the other.

7. The actuator setup (1) according to claim 1, wherein the actuator (4) located between the electrodes (E) consists of one or more layers of square or circular shaped dielectric elastomer.

8. The actuator setup (1) according to claim 1, wherein the body (2) is a wing, vertical stabilizer, horizontal stabilizer or an airframe.

9. The actuator setup (1) according to claim 1, comprising a control unit (6) that controls each of the front strengtheners (501) and each of the rear strengtheners (502) individually according to user-given commands and enables the strengtheners to be triggered separately by electrical energy.

10. The actuator setup (1) according to claim 9, wherein the control unit (6) that enables the actuators (4) to be triggered receives commands from a flight crew or autopilot software.

\* \* \* \* \*